United States Patent
Lee et al.

(10) Patent No.: US 6,680,663 B1
(45) Date of Patent: Jan. 20, 2004

(54) PERMANENT MAGNET STRUCTURE FOR GENERATION OF MAGNETIC FIELDS

(75) Inventors: Seong-Jae Lee, Ames, IA (US); David Jiles, Ames, IA (US); Karl A. Gschneidner, Jr., Ames, IA (US); Vitalij Pecharsky, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 09/814,640

(22) Filed: Mar. 22, 2001

Related U.S. Application Data (60) Provisional application No. 60/191,926, filed on Mar. 24, 2000.

(51) Int. Cl.$^7$ .................................................. H01F 7/02
(52) U.S. Cl. ........................................ 335/306; 335/302
(58) Field of Search ..................... 335/210–214, 335/284, 296–306; 315/5.34, 5.35

(56) References Cited

U.S. PATENT DOCUMENTS

| | | | |
|---|---|---|---|
| 4,835,506 A | 5/1989 | Leupold | 335/306 |
| 4,837,542 A | 6/1989 | Leupold | 335/306 |
| 4,861,752 A | 8/1989 | Leupold | |
| 4,887,058 A | 12/1989 | Leupold | 335/216 |
| 4,990,879 A * | 2/1991 | Aubert | 335/306 |
| 5,072,204 A | 12/1991 | Leupold | 335/306 |
| 5,216,401 A | 6/1993 | Leupold | 335/306 |
| 5,635,889 A | 6/1997 | Stelter | 335/306 |
| 5,719,469 A * | 2/1998 | Leupold | 335/306 |
| 5,886,609 A | 3/1999 | Stelter | 335/306 |
| 5,990,774 A | 11/1999 | Leupold | 335/306 |

FOREIGN PATENT DOCUMENTS

WO    WO93/22778    * 11/1993

OTHER PUBLICATIONS

Novel High–Field Permanent Magnet Flux Sources, IEEE Trans Magn. vol. 23, pp. 3628–3629, 1987, H.A. Leupold and E. Potenziani II, (no month).

Approaches to Permanent Magnet Circuit Design, IEEE Trans. Magn. vol. 29, pp. 2341–2346, 1993, H.A. Leupold, (no month).

Design of Permanent Magnet Multipole Magnets With Oriented Rare Earth Cobalt Material, Nucl. Instrum. Methods, vol. 169, 1–10, 1980, K. Halbach, (no month).

Toroidal Electron Beam Radiation Sources, IEEE Transactions on Magnetics, Fol. 33, pp. 3418–3419, Herbert A. Leupold, Anu S. Tilak and Ernest Potenziani II, (no date).

Permanent Magnet Assembly for MRI Devices, Podolski, p. 149, (no date).

A 3–D Permanent Magnet Helical Wiggler Model, Wiggler Technology, p. 111, M. S. Curtin, (no date).

* cited by examiner

*Primary Examiner*—Lincoln Donovan
(74) *Attorney, Agent, or Firm*—Leydig, Voit & Mayer, Ltd.

(57) ABSTRACT

A permanent magnet structure for maximizing the flux density per weight of magnetic material comprising a hollow body flux source for generating a magnetic field in the central gap of the hollow body, the magnetic field having a flux density greater than the residual flux density of the hollow body flux source. The hollow body flux source has a generally elliptic-shape, defined by unequal major and minor axis. These elliptic-shaped permanent magnet structures exhibit a higher flux density at the center gap while minimizing the amount of magnetic material used. Inserts of soft magnetic material proximate the central gap, and a shell of soft magnetic material surrounding the hollow body can further increase the strength of the magnetic field in the central gap by reducing the magnetic flux leakage and focusing the flux density lines in the central gap.

22 Claims, 8 Drawing Sheets

PERMANENT MAGNET STRUCTURE FOR GENERATION OF MAGNETIC FIELDS

CROSS-REFERENCE TO RELATED PATENT APPLICATIONS

This patent application claims the benefit of U.S. provisional patent application 60/191,926, filed Mar. 24, 2000.

STATEMENT REGARDING FEDERALLY SPONSORED RESEARCH OR DEVELOPMENT

This invention was made in part with Government support under Contract Numbers W-7405-Eng-82 and DE FC02-98EE505. The Government may have certain rights in this invention.

FIELD OF THE INVENTION

The present invention relates generally to permanent magnets, and more particularly relates to permanent magnet structures.

BACKGROUND OF THE INVENTION

Recent developments utilizing magnetic fields often require fields having very high strengths, i.e. high flux densities. The flux densities needed for these applications frequently exceed 1 to 2 Tesla (T). For example, solid magnetic refrigerants exhibit the magnetocaloric effect in the presence of magnetic fields of 1 T and above, and MRI machines employ magnetic fields having flux densities around 2 T. In order to obtain high flux densities above 1 or 2 T, electromagnets have almost exclusively been used. It is also common to employ a superconducting solenoid which greatly reduces electrical resistance and provides a high powered, superconducting magnet.

Unfortunately, electromagnets require large power supplies for charging and superconducting magnets require extensive cooling systems to maintain the solenoid below certain critical low temperatures. Liquid helium is typically used and must be replenished periodically to cool the magnet, which makes the magnet inherently large and expensive. Not only do these attributes increase the cost of high powered electromagnets, but they also diminish, if not eliminate, the portability of electromagnets due to their large size and weight, especially those capable of generating very strong magnetic fields.

Permanent magnets offer an alternative magnetic flux source to electromagnets, and do not require large power supplies or cooling systems. Nonetheless, permanent magnets in the past have been unable to generate magnetic flux densities commensurate with electromagnets. Recent advances in permanent magnets, however, have greatly increased the magnetic flux densities of permanent magnets. For example, the use of rare-earth metals such as Neodymium (Nd) and Samarium (Sm) have increased the strength of permanent magnets. The most widely used permanent magnets currently are Nd—Fe—B and $SmCo_5$. Furthermore, arrangement techniques employing these materials have produced permanent magnets that can produce magnetic fields having flux densities of 2 T.

With regard to permanent magnet arrangement techniques, the underlying concept is to construct arrays of magnet segments in a fashion whereby their magnetization vectors are aligned and cooperate to create a coherent magnetic field of greater strength. In other words, the flux density of the combined field is greater than the residual flux density (remanence) of the magnetic material itself. For example, a "magic ring", also known as a hollow cylinder flux source (HCFS) is a conventional configuration that combines as few as 8 magnetic segments in a disc or tube-like structure that defines an opening or gap through the center. The magnetization vectors are aligned to create a magnetic field in the central gap having a higher flux density than the residual flux density of the magnet segments. Similarly, a "magic sphere", also known as a hollow spherical flux source (HSFS) comprises an array of magnets constructed in a spherical configuration, leaving a gap at the central of the sphere. A small bore is provided through the sphere for access to the center gap, where a high flux density is created.

HCFSs and HSFSs employing rare-earths have been constructed to generate strong magnetic fields having high flux densities per net weight of magnetic material. While these permanent magnets provide benefits over superconducting electromagnets in terms of weight, cost and mobility, their mass production would require an enormous consumption of rare-earths. Further, rare-earths are very expensive compared to iron, nickel and cobalt. It would therefore be ideal to use a magnet array structure that maximizes the flux density generated by a given weight of magnetic material. The cost reduction allowed by constructing the magnet structures with the least amount of material for a given field strength will be extremely important.

BRIEF SUMMARY OF THE INVENTION

In light of the above, a general object of the present invention is to provide a permanent magnet flux source that maximizes the flux density generated per weight of the magnetic material.

In that regard, it is also an object of the present invention to provide a new permanent magnet array structure whereby higher flux densities are created without the need for additional or new magnetic material.

In accordance with these objectives, a permanent magnet structure has been provided for maximizing the flux density per weight of permanent magnet material comprising a hollow body flux source for generating a magnetic field in the central gap of the hollow body. The magnetic fields within the hollow body flux source are oriented to generate a coherent and uniform magnetic field in the central gap having a flux density greater than the residual flux density of the fields within the hollow body flux source. The hollow body flux source has a generally elliptic-shape, defined by unequal major and minor axes. The major axis is disposed generally parallel to the magnetic flux lines generated in the central gap. This particular structure results in a magnetic field in the center gap having a flux density greater than comparable "magic cylinders" or "magic spheres," where the major and minor axes are equal.

It is a feature of the present invention to provide an elliptic-shaped hollow body flux source in the form of an elongate tube wherein the cross-sectional shape of the tube is elliptical. Similarly, the elliptic-shaped hollow body flux source may take the form of an ellipsoid or ovoid. These elliptic-shaped structures exhibit the unequal major and minor axis which result in a higher flux density at the center gap of the hollow body while minimizing the amount of magnetic material used.

It is a further feature of the present invention to provide the hollow body flux source with an insert of soft magnetic material in the central gap, and a shell of soft magnetic material surrounding the hollow body. The soft magnetic material has high permeability such that the insert and shell reduce the magnetic flux leakage and focus the flux density lines in the central gap.

Other objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention, and together with the description serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
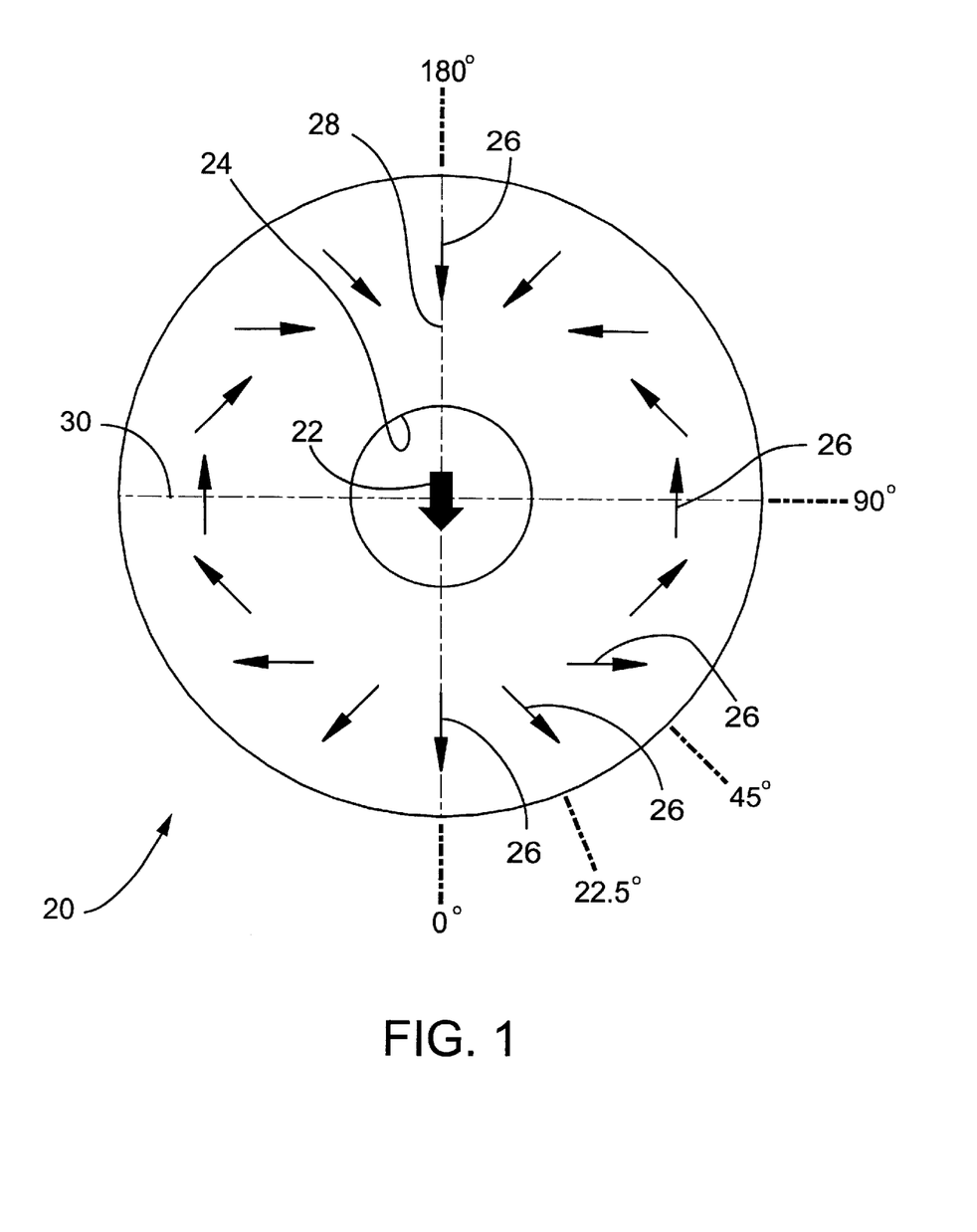
FIG. 1 is a cross-sectional view of an ideal hollow body flux source.

Referring now to the drawings, FIG. 1 shows a cross-section of an ideal circular hollow body flux source 20, suitable for both "magic cylinders" and "magic spheres." In the circular body 20, the major axis 28 and minor axis 30 are equal. The body 20 is magnetized, and arrow 22 represents the magnetic field generated in the center gap 24 by the hollow body flux source 20. A magnetic field, as will be referred to herein, has a given magnetic flux density representing the strength of the field, generally measured in Teslas (T). The field strength of the magnetic material itself, i.e. residual flux density, is also termed the remanence of the material, which is the magnetic induction that remains in a material after removal of the magnetizing force. A magnetic field is also focused in a given direction, referred to herein as a magnetization vector. Turning to FIG. 1, the hollow body flux source 20 is comprised of a magnetic material, which is magnetized, i.e. has a given remanence or residual flux density, as indicated by the plurality of magnetization vectors 26.

In the ideal hollow body flux source 20, the magnetization vectors 26 are arranged according to the Hallbach rotation theorem, to generate a coherent magnetic flux density in the central gap of the hollow body 20. For the purpose of reference in FIG. 1, the angular position of the lowest point of the circular cross-section has been denoted as 0°, and the highest point of the circle represents 180°, as it is opposite 0°. To generate the strong and coherent magnetic field 22 in the center gap 24, the magnetization vectors 26 sequentially rotate a total of 360° between 0° and 180°. At 22.5°, the corresponding magnetization vector 26 at that point is rotated 45° (twice the corresponding angular position), relative to the magnetization vector 26 at 0°. Similarly, the magnetization vector 26 at 90° is rotated 180° relative to the 0° magnetization vector, and so on to the angle of 180° where the magnetization vector 26 has rotated a full 360°.

In this ideal case, the magnetic flux density of the magnetic field 22 generated in the center gap 24 is given by the following equation for cylinders $$B=B_r \ln(r_o/r_i) \tag{1}$$

and the equation $$B=4/3 B_r \ln(r_o/r_i) \tag{2}$$

for spheres, where $B_r$ is the magnetic remanence, or residual flux density, of the hollow body flux source 22, and $r_o$ and $r_i$ are the outer and inner radii of the circular cross-section, respectively. Based upon these equations, it can readily be understood that the structure of a HCFS or an HSFS having a given remanence $B_r$, is capable of generating a magnetic flux density B in the center gap that is greater than the remanence $B_r$, i.e. the residual flux density of the magnetic material. However, it is not feasible to construct the ideal HCFS or HSFS, and thus permanent magnet arrays of individually magnetized segments are used to approximate the ideal case.

Figure 2:
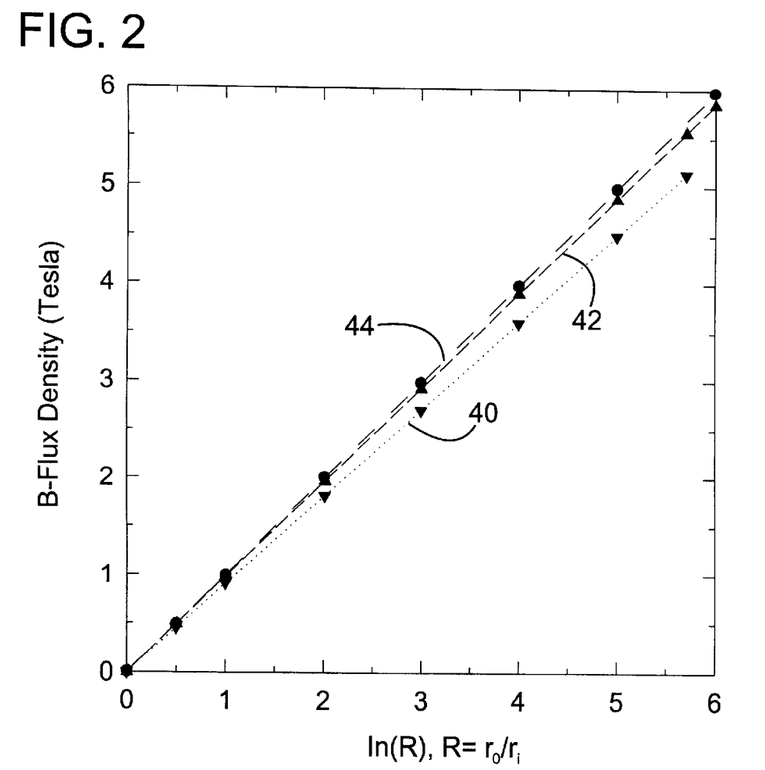
FIG. 2 is a chart showing test data of the magnitude of the flux densities in the central gap for permanent magnet arrays having different numbers of segments.

FIG. 2 is a chart showing calculations for the magnetic flux density B of three permanent magnet arrays each having an assumed remenence, $B_r$, of 1 Tesla (T) and coercivity, $H_c$, of 795 KA/m. It is known that a permanent magnet material having a higher coercivity and the same remanence will produce a higher magnetic field in the central gap, and thus the coercivity remains a fixed value. The flux densities are shown for a range of outer to inner radii ratios in logarithm, and data was taken for arrays having 8, 16, and 32 magnet segments. As shown in FIG. 2, data line 40 represents an 8 segment array, data line 42 represents a 16 segment array, and data line 44 represents a 32 segment array. Generally, the flux densities achieved were 90%, 97% and 99% of the ideal flux density, for the 8, 16 and 32 segment arrays, respectively. It can therefore be seen that permanent magnet arrays having as few as 8 segments readily approach the flux densities ideally obtainable in hollow body flux sources.

Figure 3:
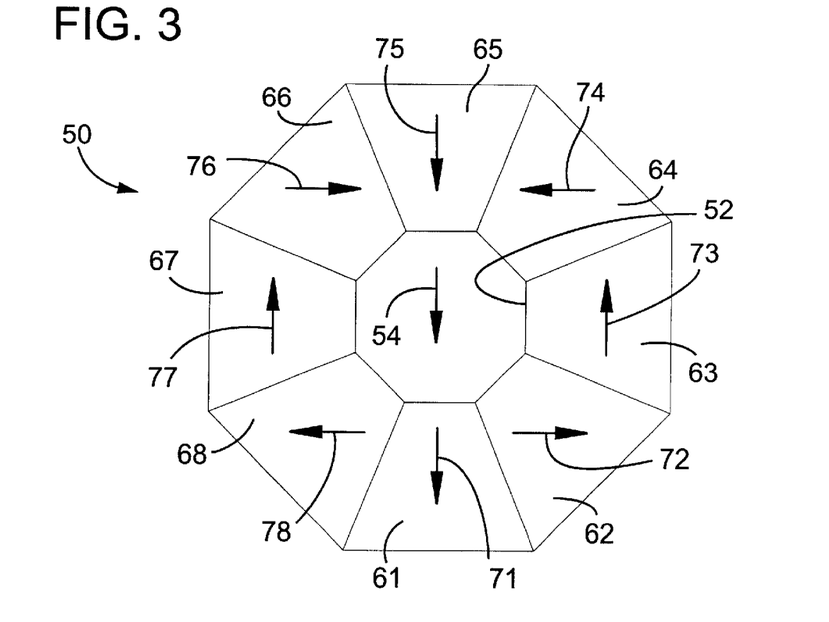
FIG. 3 is a cross-sectional view of a circular-shaped magnet array.

According to these principles, magic cylinders may be constructed using arrays of 8 permanent magnet segments, a cross-section of which is shown in FIG. 3. The permanent magnet array 50 comprises eight symmetrical magnet segments 61, 62, 63, 64, 65, 66, 67, 68. The segments contact the adjacent segments to form a hollow cylinder defining a central gap 52. Each segment 61, 62, 63, 64, 65, 66, 67, 68 is magnetized in a given direction as shown in FIG. 3 by magnetization vectors 71, 72, 73, 74, 75, 76, 77, 78, respectively. These magnetization vectors are aligned relative to each other to generate a magnetic field, shown as arrow 54 in FIG. 3, in the central gap 52 having a magnetic flux density that is greater than the residual flux density, or remanence, of the magnet segments in the array 50.

In accordance with the present invention, a hollow body flux source is provided wherein the magnetic field within the hollow body flux source is oriented to generate a magnetic field in the central gap having a flux density greater than the residual flux density of the magnetic field within the hollow body flux source. The hollow body flux source of the present invention is elliptic-shaped, meaning that the hollow body is elongated as defined by unequal major and minor axes, the axes being perpendicular to each other. As used herein, the ratio of the major axis to the minor axis will be denoted the ellipticity ($\epsilon$) of the shape. The elliptic-shape may take the form of a hollow ellipsoid or ovoid flux source, and may also take the form of a hollow tubular flux source where the cross-sectional shape of the tube is elliptical. The elliptic-shape also encompasses approximations to an ellipse made up of a plurality of discrete non-elliptical segments. The common feature between all of the possible elliptic-shaped structures is that they exhibit unequal major and minor axes.

Figure 4:
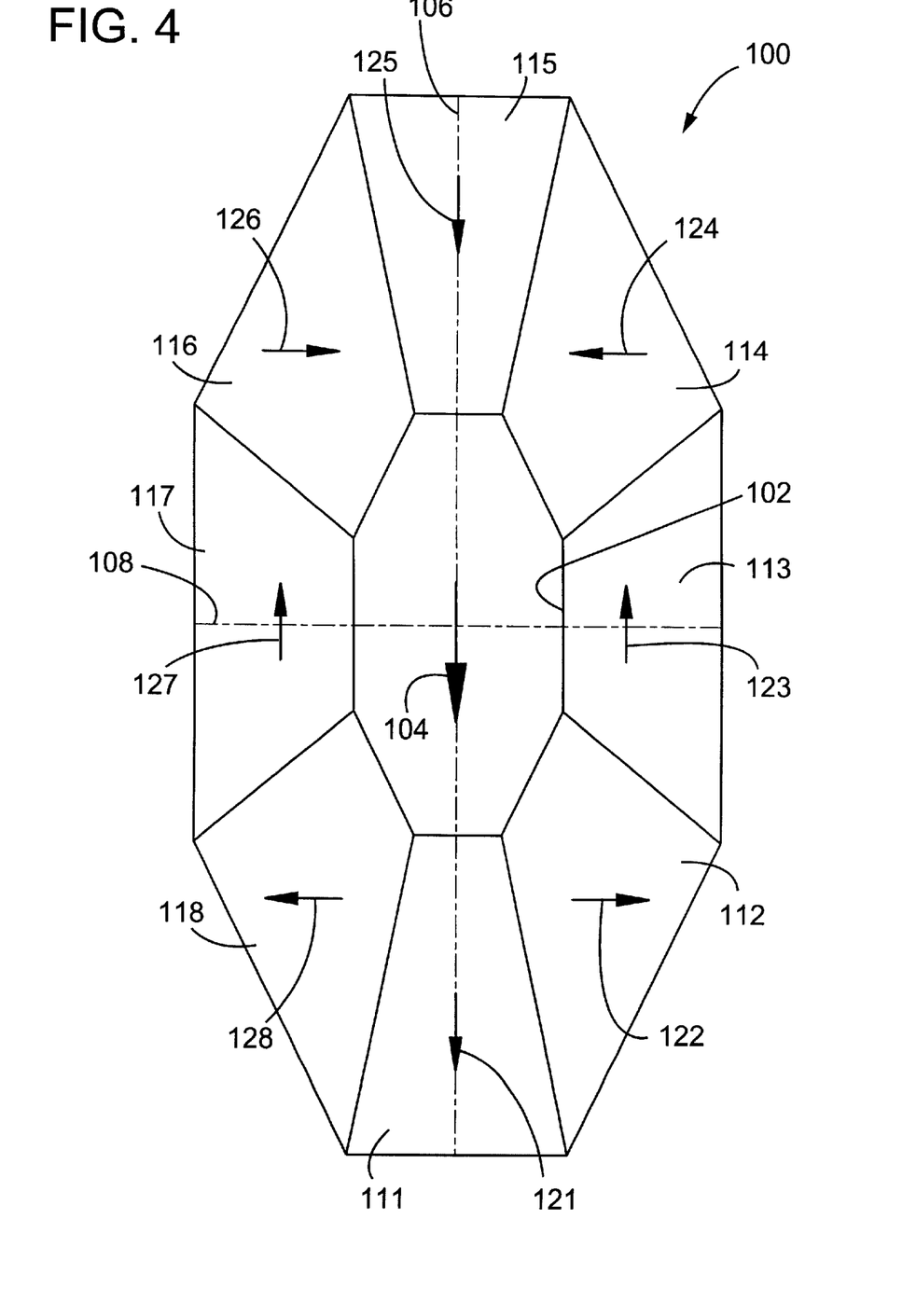
FIG. 4 is a cross-sectional view of an elliptic-shaped magnet array according to the present invention.

Accordingly, a cross-sectional view of an embodiment of a permanent magnet array according to the present invention is shown in FIG. 4, wherein the magnet array 100 is elliptic-shaped, and defines a central gap 102. It can be seen that the permanent magnet array 100 includes a major axis 106 and a minor axis 108. The major and minor axes 106, 108 are unequal, and particularly, the major axis 106 is larger than the minor axis 108, thus defining the elliptic-shape of the magnet array 100. It will be understood by those in the art that the cross-section of FIG. 4 adequately represents magnet arrays of both the cylindrical or tube type, as well as the spheroidal type (i.e. ellipsoid). As shown in FIG. 4, the permanent magnet array 100 is comprised of eight magnet segments 111, 112, 113, 114, 115, 116, 117, 118. Each of the segments is magnetized, having a magnetization vector represented by arrows 121, 122, 123, 124, 125, 126, 127, 128. The magnetization vectors are aligned relative to each other according to the rotation theorem, to produce a magnetic field, shown as arrow 104, in the central gap 102. The flux density of the magnetic field 104 is greater than the remanence of the permanent magnet array 100. Further, the direction of magnetic field 104 is parallel to the major axis 106.

Figure 5:
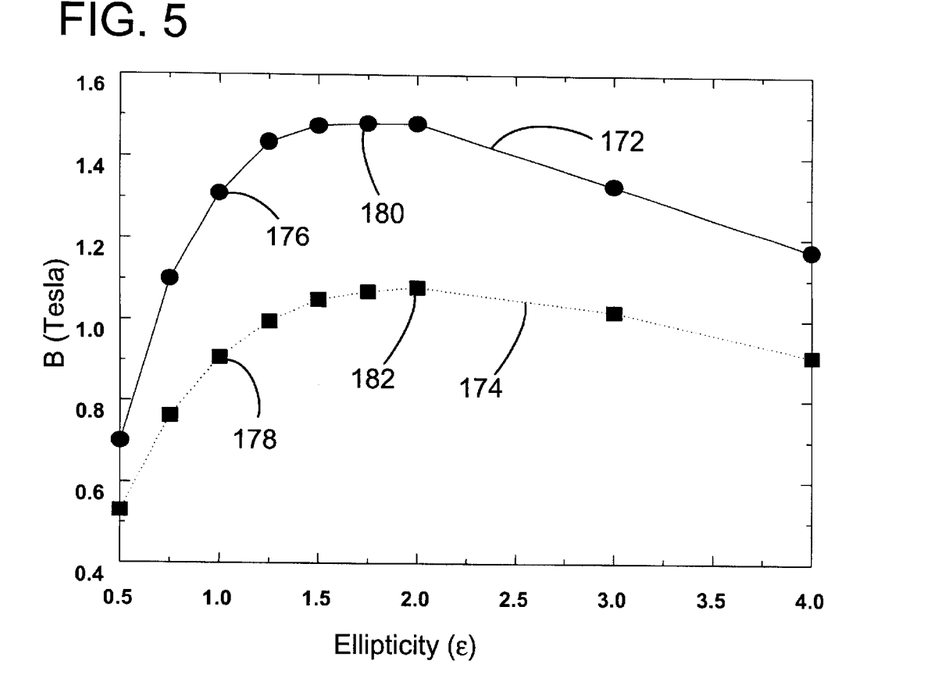
FIG. 5 is a chart showing test data of the magnitude of the flux densities in the central gap in relation to the ellipticity of two permanent magnet arrays.

The benefits of the elliptic-shaped magnet array 100 shown in FIG. 4 will be discussed with reference to FIG. 5. FIG. 5 is a chart showing data for two permanent magnet arrays, represented as lines 172 and 174. Line 172 represents data for an eight segment magnet array arranged as a generally hollow spheroidal flux source. Line 174 represents data for an eight segment magnet array arranged as a generally hollow tubular flux source. The vertical axis of the chart shown in FIG. 5 represents the flux density (B) generated in the central gap in the magnet arrays, and the horizontal axis represents the arrays' ellipticity ($\epsilon$), i.e. the ratio of the major axis to the minor axis. In these tests, the ellipticity of the magnet arrays 172, 174 was varied from 0.5 to 4, meaning that the arrays were elongated or squeezed along the major axis. For all ellipticities, the cross-sectional area ($\pi r_o^2$) of the magnet arrays remained constant. This was done to make sure that the enhancement of the magnitude of flux density in the central gap originated from the geometrical variation of the array, and not from adding more permanent magnetic material to the array. Under this condition, the semi-minor and semi-major axes of the configuration are given as $$a' = \frac{a}{\sqrt{\varepsilon}} \tag{3}$$

$$b' = a\sqrt{\varepsilon} \tag{4}$$

where $\epsilon$ is the ellipticity and a is the radius of the array. The radius for the arrays 172, 174 was 69.1 mm when the ellipticity was 1, i.e. the circular case. The height of the central air gap (along the major axis) was 25.4 mm, which remained fixed throughout all ellipticities. The shape of the central gap was kept the same as that of the cross-sectional shape of the entire array. Both arrays 172, 174 had a remanence, $B_r$, of 1 Tesla (T) and coercivity, $H_c$, of 0.796 MA/m.

As shown in FIG. 5, data point 176 represents a hollow spherical flux source and data point 178 represents a hollow cylindrical flux source, since at these points $\epsilon$=1, i.e. the bodies are circular in shape. In both cases, it can clearly be seen that as $\epsilon$ increases from 1, the magnetic flux density (B) for the magnet arrays also increases, peaking at an ellipticity of $\epsilon$=2 in both cases. More particularly, the spheroidal magnet array represented by line 172 at $\epsilon$=1 has a magnetic flux density (B) of approximately 1.3 T. As the ellipticity ($\epsilon$) increases to 2, the magnetic flux density (B) increases to approximately 1.5, shown as data point 180. Likewise the tubular magnet array represented by line 174 shows an increase in flux density as the ellipticity ($\epsilon$) is increased from 1 to 2. Here, B increased from approximately 0.9 Tesla to 1.1 Tesla, shown as data points 178 and 182, respectively. Therefore, it can clearly be seen that in the spheroidal array, the enhancement of the flux density was approximately 13% when the ellipticity increased from 1 to 2. In the case of the tubular array, the enhancement of the flux density was approximately 19% for the same change in ellipticity. Even as the ellipticity is increased beyond 2, the benefits of the elliptic-shaped magnet arrays represented by lines 172, 174 are maintained through ellipticities 3 and 4, respectively. Furthermore, the benefits may also be attained for even higher ellipticities, upwards of $\epsilon$=5, depending upon the particular permanent magnet array structure.

Figure 6:
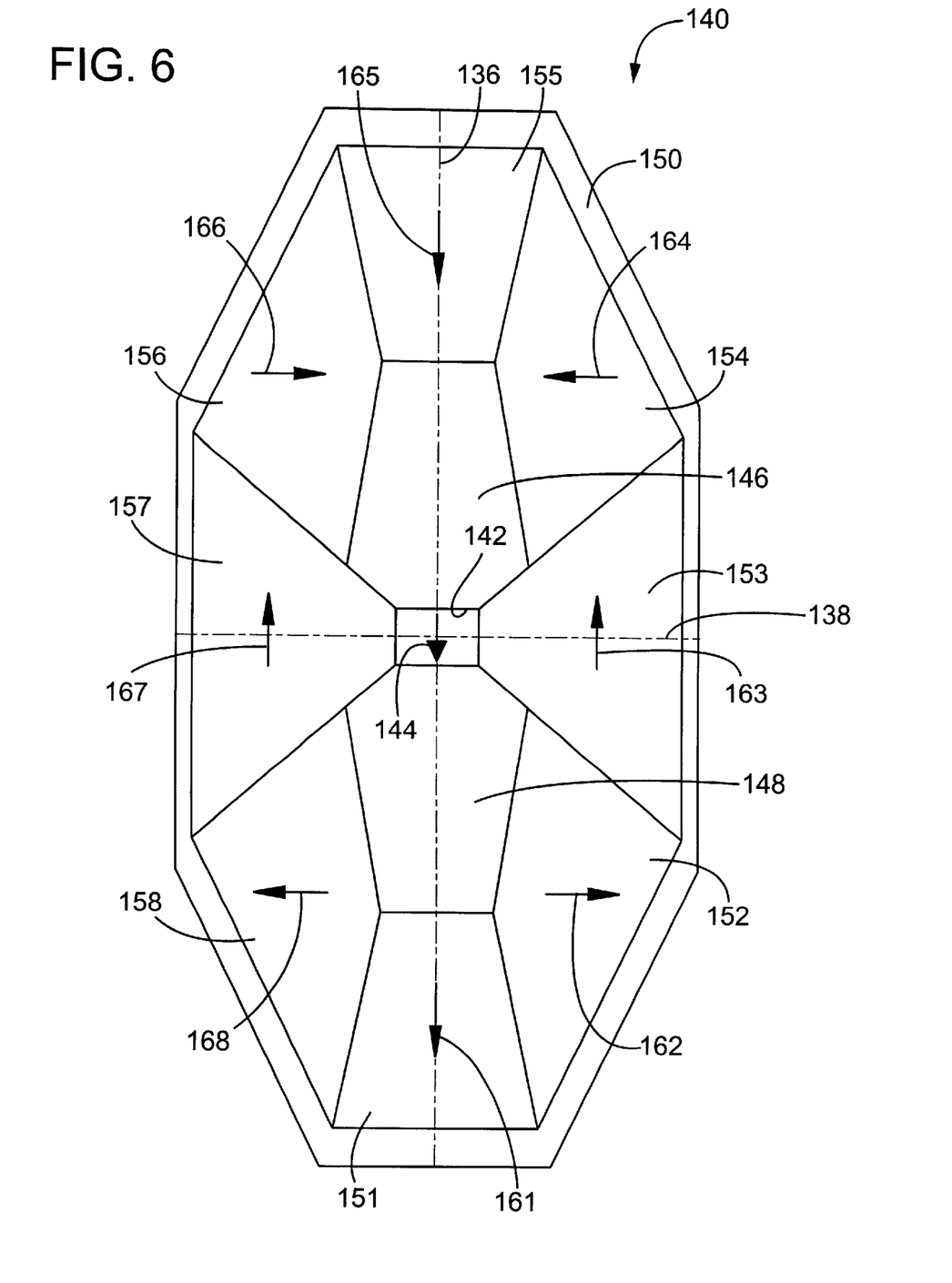
FIG. 6 is a cross-sectional view of an embodiment of an elliptic-shaped magnet array employing soft magnetic materials according to the present invention

Another embodiment of a magnet array according to the present invention is shown in FIG. 6. Magnet array 140 is generally elliptic-shaped and defines a central gap 142. Magnet array 140 includes a major axis 136 and a minor axis 138, which are unequal, the major axis 136 being larger than the minor axis 138 to thereby define the elliptic-shaped structure of array 140. The array 140 is comprised of 8 magnetic segments 151, 152, 153, 154, 155, 156, 157, 158, arranged circumferentially around the central gap 142, engaging adjacent segments. As in the magnet array of FIG. 4, the magnetic segments 151, 152, 153, 154, 155, 156, 157, 158 are magnetized as indicated by magnetization vectors 161, 162, 163, 164, 165, 166, 167, 168, respectively. The magnetization vectors are aligned relative to each other to produce a uniform magnetic field, represented by arrow 144, in the central gap 142. The flux density of the magnetic field 144 is greater than the remanence of the permanent magnet array 140.

As shown in FIG. 6, the array 140 further includes inserts 146 and 148, both inserts consisting of a soft magnetic material. The permanent magnet array 140 also includes a magnetic shell 150, also consisting of a soft magnetic material. The soft magnetic material of inserts 146, 148 and shell 150, is defined by a high permeance (P). Permeance can most easily be thought of as the reciprocal of reluctance (R), which is the resistance to the penetration of magnetic flux. Therefore, these portions of magnet array 140 can be used to focus the magnetic field 140 in the central gap 142, and minimize flux leakage. Inserts 146 and 148 are positioned adjacent the central gap 142, acting as poles to focus the magnetic field 144 therein. In the preferred embodiment, inserts 146 and 148 are disposed on opposing sides of the central gap 142, in alignment with the major axis 136 and hence magnetic field 144 as well. Similarly, magnetic shell 150 is placed around the outer portions of array 140 to minimize the leakage of the magnetic field and guide the field toward the center gap 142.

Figure 7:
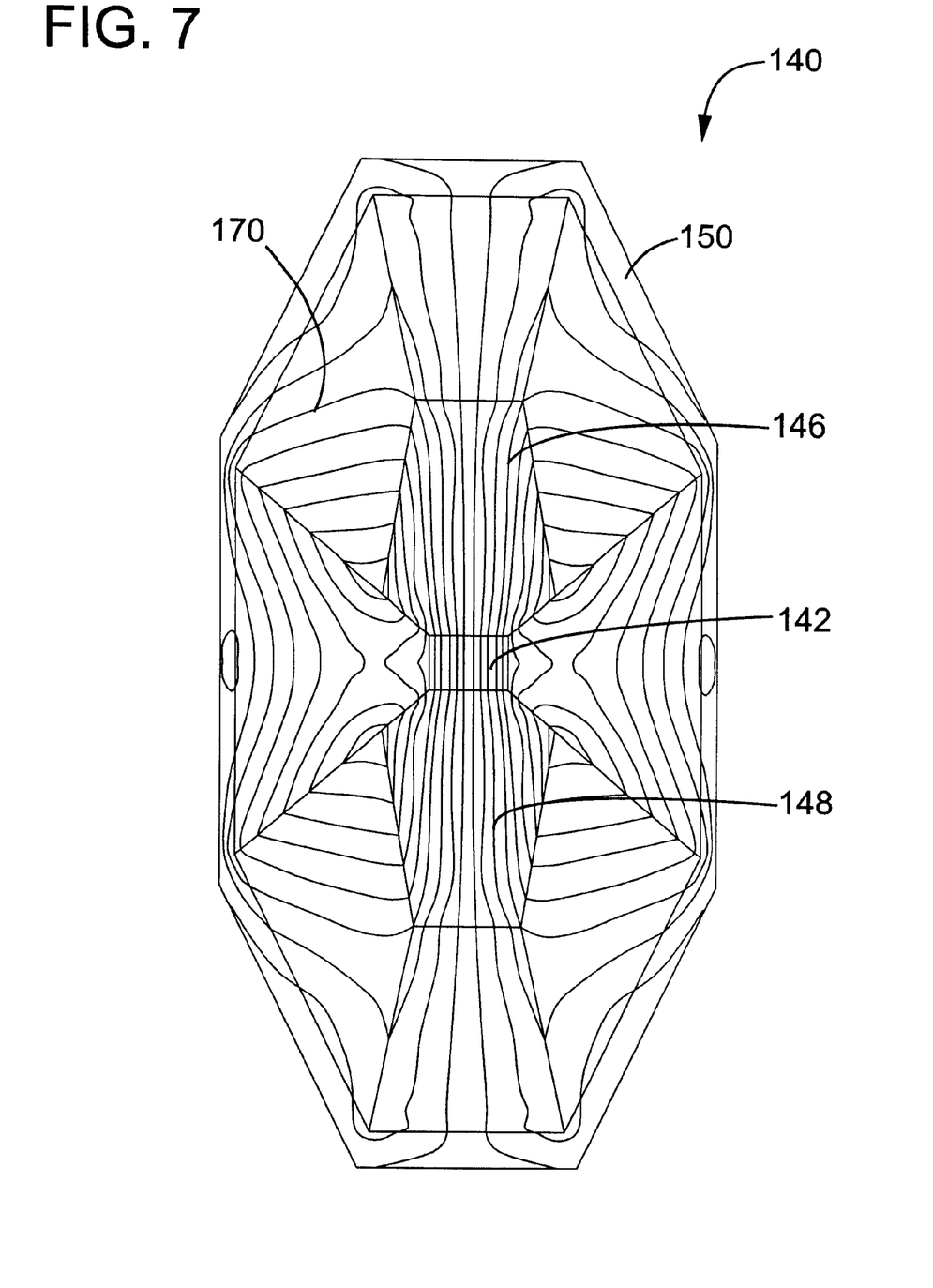
FIG. 7 illustrates the flux lines for the elliptic-shaped magnet array of FIG. 6.

FIG. 7 illustrates the magnetic flux lines of the magnetic field flowing through magnet array 140, described above and shown in FIG. 6. The lines 170 represent the magnetic flux lines flowing throughout the array 140. It can be seen that the flux lines 170 in the central gap 142 are of very high density. Furthermore, inserts 146, 148, and shell 150 serve to minimize flux leakage and focus the magnetic field in the central gap 142.

Figure 8:
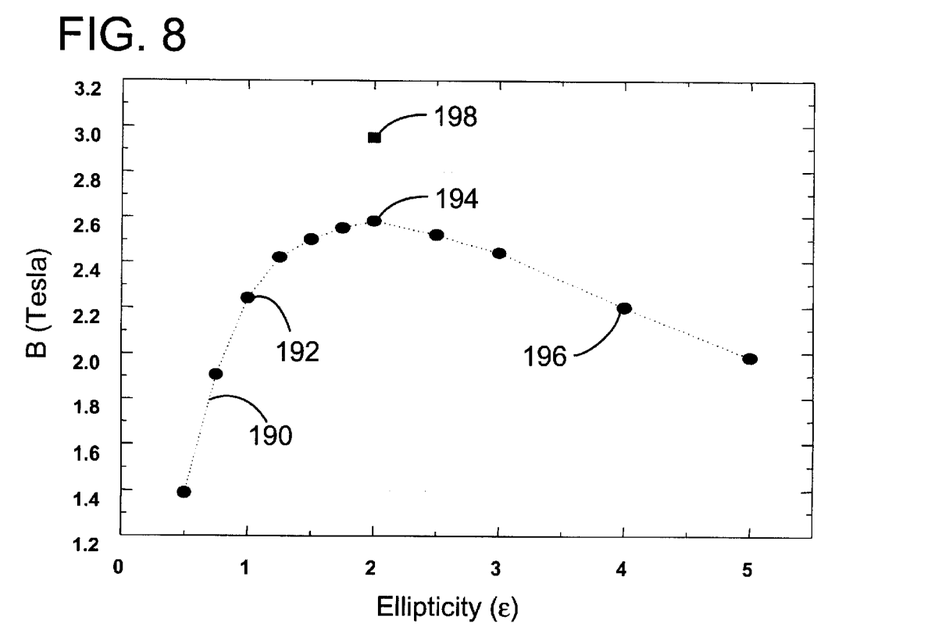
FIG. 8 is a chart showing test data of the magnitude of the flux density in the central gap in relation to the ellipticity of a permanent magnet array having a soft magnetic insert and shell.

FIG. 8 shows data for a permanent magnet array arranged according to the embodiment shown in FIGS. 6 and 7 as previously described. The ellipticity ($\epsilon$) of the magnet array was again varied and data was computed for the corresponding magnetic flux density, B, measured in Teslas. The array was arranged as the generally tubular type with an outer radius ($r_o$) of 96.4 mm at $\epsilon$=1. The central gap height was 15.2 mm. As the ellipticity of the array was varied, the cross-sectional area ($\pi r_o^2$) was maintained at a constant value. Nd—Fe—B was used for the magnetic segments, having a magnetic energy of 35 MGOe, remanence of 1.2 T, and coercivity of 1.5 MA/m. FeVCo was used for the inserts and shell of soft magnetic material, the material having a non-linear B-H curve.

Referring to FIG. 8, the data is shown as line 190, and it can be seen that at an ellipticity of $\epsilon$=1, the magnetic flux density of the permanent magnet array was approximately 2.25 T, shown as data point 192. At an ellipticity of $\epsilon$=2, the magnetic flux density was approximately 2.6 T, shown as data point 194. Even as the ellipticity was further increased, the benefits of an elliptic-shaped magnet array were maintained. For example, an ellipticity of $\epsilon$=4, the magnetic flux density remained approximately equal to the flux density of an ellipticity of $\epsilon$=1, i.e. data point 196 is approximately equal to data point 192. Again, the highest magnetic flux density was obtained when $\epsilon$=2. Data point 198 indicates the result obtained when a linear magnetic permeability of $\mu_r$=$10^5$ was used for the soft magnetic material instead of the known value for FeVCo. It can be seen that such an array results in a magnetic field in the central gap of nearly 3 T.

Figure 9:
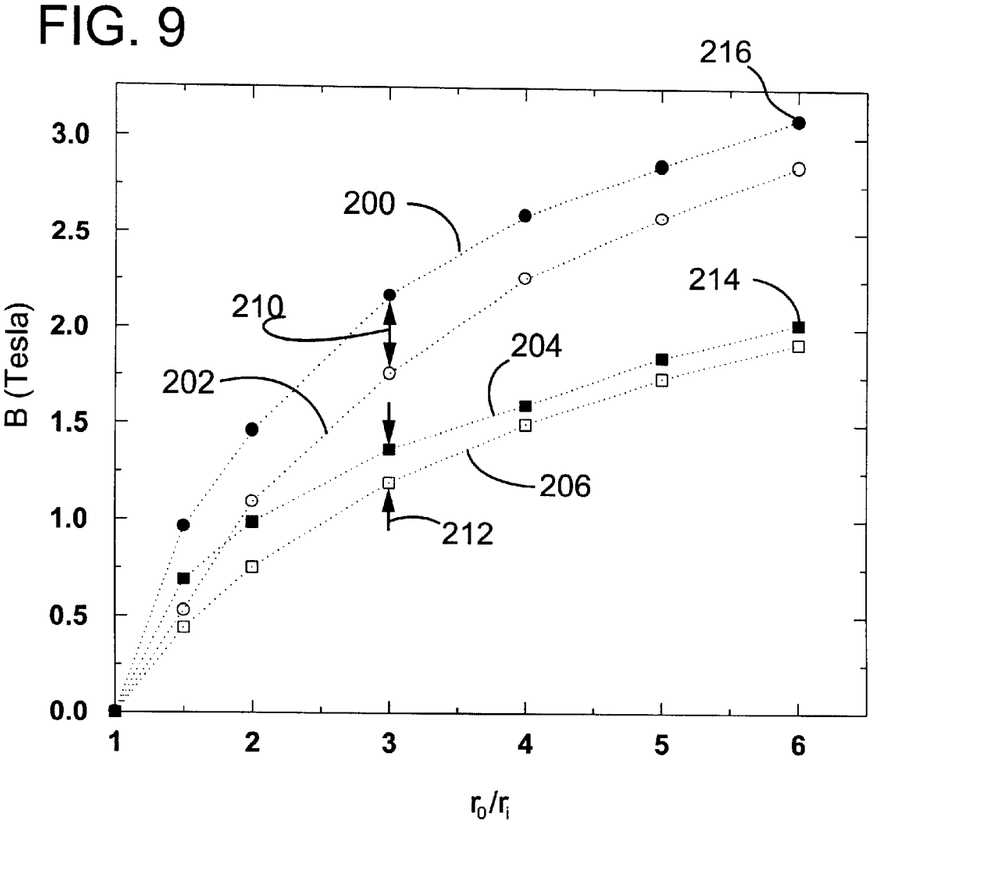
FIG. 9 is a chart showing test data comparing the flux density for elliptic-shaped magnet arrays according to the preset invention to the flux densities of circular-shaped magnet arrays.

The benefits of elliptic-shaped permanent magnet arrays arranged according to the present invention will be further discussed with reference to FIG. 9. FIG. 9 is a chart representing test data for four different cylindrical magnet arrays. Line 200 represents a magnet array having an ellipticity of 2, a gap width of 15 mm, wherein soft magnetic material is used as previously described with reference to FIG. 6. Line 202 represents a magnet array having a ellipticity of 1, a gap width of 15 mm, wherein soft magnetic material is also used. Line 204 represents data taken for a magnet array having an ellipticity of 2, a gap width of 25.4 mm, wherein no soft magnetic material is used. Line 206 represents a permanent magnet array having an ellipticity of 1, a gap width of 25.4 mm, wherein no soft magnetic material is used. Thus the two arrays without soft magnetic material differ only in ellipticity ($\epsilon$), as do the two arrays having soft magnetic material. For each of the arrays, the magnetic flux density B in the central gap was determined for varying ratios of the outer to inner radius.

It can be seen that for all ratios of the outer to inner radius, the magnet arrays having an ellipticity of 2 generated higher magnetic flux densities in the central gap than the corresponding magnet array having an ellipticity of 1. As the ratio of outer radius to inner radius was increased for each of the arrays, the central gap width was maintained constant. By way of example, where the ratio of outer radius to inner radius equals 3, the magnet array represented by line 200 generated a higher flux density than the corresponding magnet array having an ellipticity of 1, represented by line 202. This difference has been denoted by double headed arrow 210, showing a difference of approximately 0.5 Tesla between the two magnet arrays. Similarly, at the same ratio the permanent magnet array represented by line 204 exhibited a larger magnetic flux density in the central gap than the corresponding magnet array having ellipticity of 1, represented by line 206. Here, the difference was approximately 0.25 Tesla, represented by arrows 212.

As also shown in FIG. 9, the permanent magnet arrays having an ellipticity of 2 are capable of generating extremely high magnetic flux densities in the central gap. The array represented by line 204, having an ellipticity of 2, a gap width of 25.4 mm, in which no soft magnetic material was used, is capable of generating a magnetic field of approximately 2 Tesla where the ratio of outer radius to inner radius is 6, indicated as data point 214 on FIG. 9. With regard to the magnet array represented by line 200, magnetic flux densities in the central gap exceeded 3 Tesla where the ratio of outer radius to inner radius was 6, indicated as data point 216.

Figure 10:
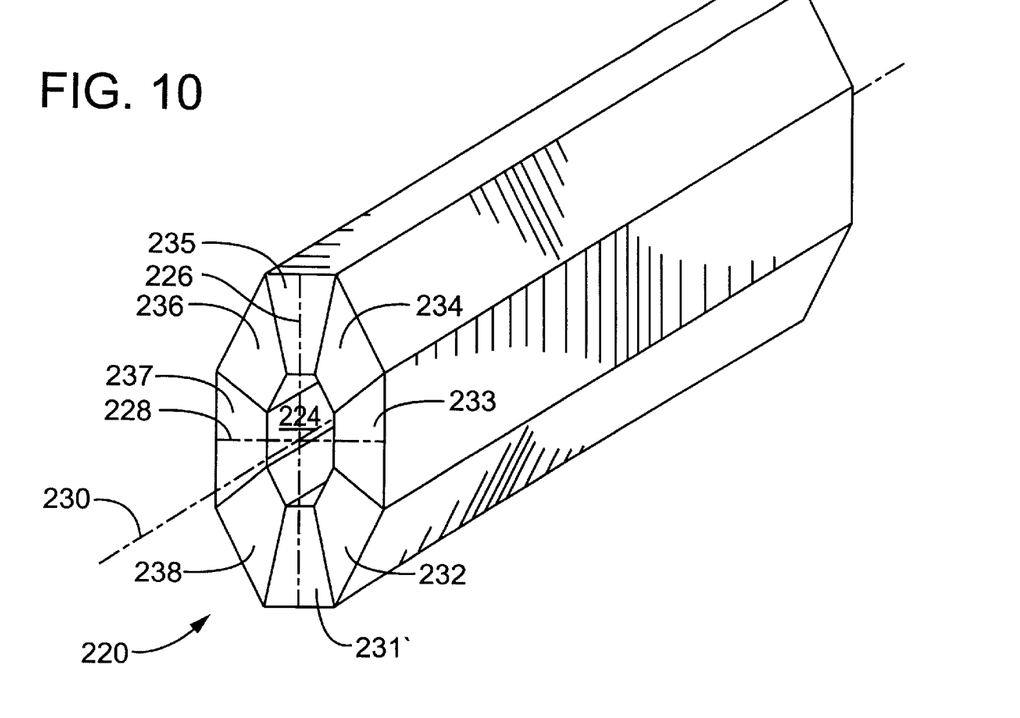
FIG. 10 illustrates an embodiment of an elliptic-shaped array according to the present invention.

Turning to FIG. 10, a perspective view is shown for an embodiment of an elliptic-shaped permanent magnet array constructed according to the present invention, the array 220 being of the cylindrical or tubular type. The permanent magnet array 220 comprises eight magnet segments 231, 232, 233, 234, 235, 236, 237, 238 serially arranged, contacting the adjacent segments to define a central gap 224. The magnetization vectors of the segments are arranged according to the rotation theorem to produce a coherent and uniform magnetic field in the central gap 224 that is larger than the remanence of the permanent magnet material of the array 220. The array 220 is elliptic-shaped, as defined by the unequal major axis 226 and minor axis 228, the major axis 226 being larger than the minor axis 228. The elliptic-shape of the array 200 has been extruded or elongated along a third axis 230 that is mutually perpendicular to the major and minor axes 226, 228 to form the hollow cylindrical permanent magnet array 220 having an elliptic-shape.

The cylindrical or tubular type of elliptic-shaped permanent magnet array, such as that shown in FIG. 10, extends straight back along the third axis 230. However, the elliptic-shaped cross-section may also be extruded along a curved axis to form a curved tubular permanent magnet array. One application would be to construct a curved tubular permanent magnet array in the shape of a toroid. Furthermore, the cylindrical elliptic-shaped permanent magnet array of FIG. 10 may be segmented along the third axis 230, and then each resulting segment sequentially rotated about the axis 230 to form a "helical wiggler" or "circular wiggler" as will be understood by those in the art. A slot could also be provided in the magnet array to provide access to the central gap for refrigerant material that exhibits the magnetocaloric effect. For example, a slot could be provided through segment 233, or 235 of the array 220 shown in FIG. 10, to provide access for a disc of the refrigerant material and would only result in a small reduction of the magnetic field generated in the central gap.

Figure 11:
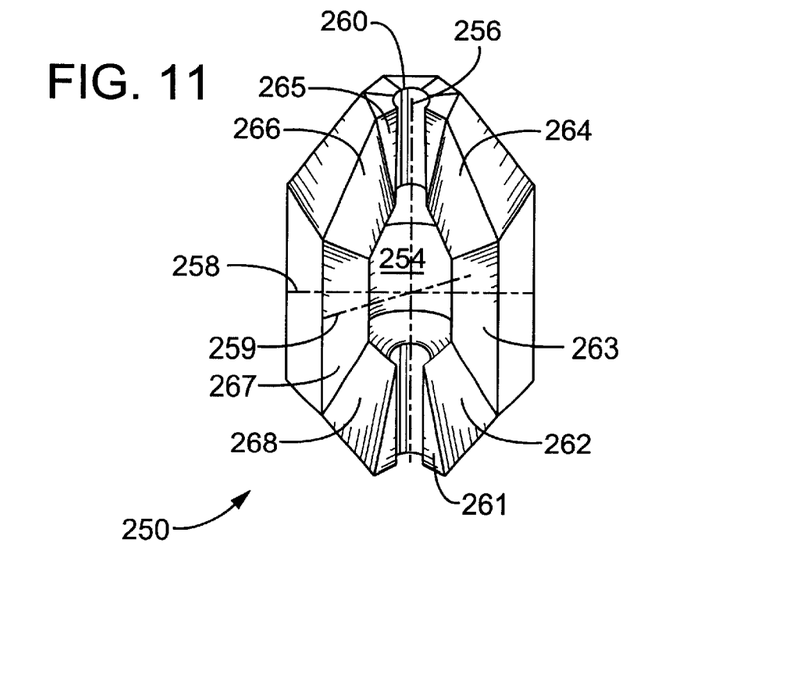
FIG. 11 illustrates another embodiment of an elliptic-shaped array according to the present invention.

FIG. 11 illustrates another embodiment of an elliptic-shaped permanent magnet array according to the present invention, the array 250 being of the spheroidal type, i.e. an ellipsoid or ovoid. FIG. 11 is a perspective view of the array 250, taken from a position slightly above the array 250. The permanent magnet array 250 is segmented along distinct lines of longitudinal meridians into sections, and as illustrated in FIG. 11 there are six such longitudinal meridians. A front one of these sections has been removed in FIG. 11, revealing permanent magnet segments 261, 262, 263, 264, 265, 266, 267, 268. All of the segments are arranged adjacent each other to form an elliptic-shaped central gap 254. The magnetization vectors of the segments are arranged according to the rotation theorem to produce a coherent and uniform magnetic field in the central gap 254 that is larger than the remanence of the permanent magnet material of the array 250. A bore 260 may be provided through the array 250 to provide access to the central gap 254 and the uniform magnetic field generated therein.

The permanent magnet array 250 includes a major axis 256, and two mutually perpendicular minor axes 258, 259, wherein the major axis 256 is larger than the two minor axes 258, 259 to define the elliptic-shape of the array. The elliptic-shape of the permanent magnet array 250 is an ellipsoid, and more particularly, the array 250 is arranged in the form of a prolate ellipsoid, as it represents a body of revolution around the major axis 256. However, it is to be understood that all ellipsoids and elliptic-shaped arrays are within the scope of the present invention, which is not to be limited by the embodiment shown in FIG. 11. While the elliptic-shaped permanent magnet array 250 shown in FIG. 11 includes 30 segments, the elliptic-shape array may contain a fewer or a larger number of segments, the greater the number of segments the closer the approximation to the ideal case.

It can therefore be seen from the foregoing that a new permanent magnet structure has been provided that maximizes the flux density of the magnetic field generated in the central gap of the structure. A low-cost, low-weight magnetic flux source is provided, which not only is portable, but also is capable of generating flux densities exceeding 3 Teslas. The portability of the permanent magnet structure is useful for mobile devices, as well as in remote locations such as spacecraft, automation and transportation. The elliptic-shaped cylindrical permanent magnet array produces a homogenous field particularly applicable to MRI machines. An exemplary application of the present invention is in a magnetic refrigeration system which provides a compact, energy efficient cooling system. The system utilizes a solid magnetic refrigerant which exhibits the magnetocaloric effect in the presence of high magnetic fields, typically 1 T or above. These refrigerants can be used in magnetic refrigerators by consumers and in commercial applications. The cooling power of the magnetic refrigeration system increases as the strength of the applied magnetic field increases. Therefore, enhancement of the magnetic flux density from a permanent magnet structure is an important factor in the improvement of the efficiency of the magnetic refrigerator system. Furthermore, the present invention reduces the consumption of rare-earth materials that would be required for the mass production of magnet arrays by maximizing the flux density generated per net weight of magnetic material, permitting the construction of permanent magnet arrangements using the least amount of material for a given field strength.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A permanent magnet structure comprising:
   a hollow body flux source for generating a magnetic field in a central gap of the hollow body flux source;
   the magnetic field within the hollow body flux source oriented to generate a magnetic field in the central gap having a flux density greater than the residual flux density of the magnetic field within the hollow body flux source; and
   the hollow body flux source being elliptic-shaped with unequal major and minor axes, the major axis being parallel to the magnetic field in the central gap, the hollow body flux source having an elliptic-shaped outer surface and an elliptic-shaped inner surface.

2. The permanent magnet structure of claim 1 wherein the ratio of the major axis to the minor axis defines an ellipticity $\epsilon$ of the hollow body flux source, $\epsilon$ being greater than 1.0 and less than 8.0.

3. The permanent magnet structure of claim 2, wherein $\epsilon$ is greater than 1.0 and less than 4.0.

4. The permanent magnet structure of claim 2, wherein $\epsilon$ is 2.0.

5. The permanent magnet structure of claim 1, wherein the hollow body flux source is an ellipsoid.

6. The permanent magnet structure of claim 1, wherein the hollow body flux source is an ovoid.

7. The permanent magnet structure of claim 1, wherein the hollow body flux source is a prolate ellipsoid.

8. The permanent magnet structure of claim 1, wherein the hollow body flux source is tubular, the tubular hollow body flux source having a cross-section of elliptical shape.

9. The permanent magnet structure of claim 1, wherein the magnetic field within the center gap is directed at a 0° angle, the magnetic orientation of the hollow body flux source at any given point being directed at an angle twice the angular position of that point.

10. The permanent magnet structure of claim 1, further comprising an insert disposed proximate the central gap, the insert being of a material having a high magnetic permeability.

11. The permanent magnet structure of claim 1, further comprising a shell substantially covering the hollow body flux source, the shell being of a material having a high magnetic permeability.

12. A permanent magnet structure comprising:
   a plurality of permanent magnets each having a magnetic field, the plurality of permanent magnets arranged in an array to define a central gap at the center of the array;
   the magnetic fields of the plurality of magnets aligned relative to each other in the array to generate a magnetic field in the central gap having a flux density greater than the residual flux density of the magnetic field of the plurality of permanent magnets; and the array of magnets having an elliptic-shape with unequal major and minor axes and an elliptic-shaped outer surface and an elliptic-shaped inner surface.

13. The permanent magnet structure of claim 12, wherein the major axis is generally parallel to the magnetic field in the central gap, the ratio of the major axis to the minor axis defining the ellipticity $\epsilon$ of the elliptic-shape, $\epsilon$ being greater than 1 and less than 8.

14. The permanent magnet structure of claim 13, wherein $\epsilon$ is approximately 2.0.

15. The permanent magnet structure of claim 12, wherein the array of magnets form one of a hollow ellipsoid flux source and a hollow ovoid flux source.

16. The permanent magnet structure of claim 12, wherein the array of magnets form a hollow tubular flux source having an elliptical cross-section.

17. The permanent magnet structure of claim 12, further comprising an insert disposed proximate the central gap, the insert being of a material having a high magnetic permeability.

18. The permanent magnet structure of claim 12, further comprising a shell substantially covering the permanent magnet array, the shell being of a material having a high magnetic permeability.

19. The permanent magnet structure of claim 12, wherein the permanent magnets each have an angular position, the magnetic field within the center gap being directed at a 0° angle, the magnetic field of each permanent magnet being directed at an angle that is double the angular position of that permanent magnet.

20. A permanent magnet array formed from a plurality of magnetic segments, the magnetic segments arranged to define a central gap, the magnetic segments being arranged to generate a magnetic field in the central gap having a flux density greater than the residual flux density of the magnetic segments, the magnetic segments being arranged such that the permanent magnet array has an elliptic-shaped cross-section, an elliptic-shaped outer surface and an elliptic-shaped inner surface.

21. The permanent magnet structure of claim 1, wherein the magnetic field within the hollow body flux source is oriented according to the Halbach theorem.

22. The permanent magnet structure of claim 1, wherein the hollow body flux source is elongated in a direction parallel to the major axis.

* * * * *